United States Patent
Emprin et al.

(10) Patent No.: US 12,092,908 B2
(45) Date of Patent: Sep. 17, 2024

(54) OPTICAL ARTICLE HAVING AN INTERFERENTIAL COATING WITH AN IMPROVED ABRASION-RESISTANCE

(71) Applicant: Essilor International, Charenton-le-Pont (FR)

(72) Inventors: Benoit Emprin, Paris (FR); Nicolas Maitre, Conflans-Sainte-Honorine (FR); Sébastien Chiarotto, Paris (FR)

(73) Assignee: Essilor International, Charenton-le-Pont (FR)

( * ) Notice: Subject to any disclaimer, the term of this patent is extended or adjusted under 35 U.S.C. 154(b) by 667 days.

(21) Appl. No.: 17/285,591

(22) PCT Filed: Oct. 17, 2019

(86) PCT No.: PCT/EP2019/078299
§ 371 (c)(1),
(2) Date: Apr. 15, 2021

(87) PCT Pub. No.: WO2020/079197
PCT Pub. Date: Apr. 23, 2020

(65) Prior Publication Data
US 2021/0397025 A1    Dec. 23, 2021

(30) Foreign Application Priority Data
Oct. 18, 2018 (EP) .................... 18306374

(51) Int. Cl.
*B32B 7/023*  (2019.01)
*G02C 7/02*   (2006.01)
*G02C 7/10*   (2006.01)
*C23C 14/08*  (2006.01)
*G02B 1/115*  (2015.01)

(52) U.S. Cl.
CPC .............. *G02C 7/107* (2013.01); *B32B 7/023* (2019.01); *G02C 7/024* (2013.01); *C23C 14/081* (2013.01); *G02B 1/115* (2013.01); *G02C 7/022* (2013.01)

(58) Field of Classification Search
CPC ........ G02B 1/115; G02C 7/024; G02C 7/107; G02C 7/022; B32B 7/023; C23C 14/081
See application file for complete search history.

(56) References Cited

U.S. PATENT DOCUMENTS

| | | |
|---|---|---|
| 5,725,959 A | 3/1998 | Terada et al. |
| 7,692,855 B2 | 4/2010 | Arrouy et al. |
| 8,982,466 B2 | 3/2015 | Neuffer |
| 2005/0074591 A1 | 4/2005 | Zagdoun |
| 2005/0238882 A1 | 10/2005 | Vu |
| 2005/0266208 A1 | 12/2005 | Raychaudhuri et al. |
| 2008/0002260 A1 | 1/2008 | Arrouy et al. |
| 2008/0206470 A1 | 8/2008 | Thomas et al. |
| 2008/0213473 A1 | 9/2008 | Roisin et al. |
| 2008/0261053 A1 | 10/2008 | Arndt et al. |
| 2010/0104838 A1 | 4/2010 | Noguchi et al. |
| 2011/0229659 A1* | 9/2011 | Reynolds ............ C23C 14/08 427/595 |
| 2012/0075705 A1 | 3/2012 | Beinat et al. |
| 2021/0397025 A1 | 12/2021 | Emprin et al. |

FOREIGN PATENT DOCUMENTS

| | | |
|---|---|---|
| EP | 1184685 | 3/2002 |
| EP | 1184686 | 3/2002 |
| EP | 1211524 | 6/2002 |
| EP | 1950321 | 7/2008 |
| EP | 2466340 | 6/2012 |
| EP | 2775341 | 9/2014 |
| EP | 2913116 | 9/2015 |
| EP | 3392680 | 10/2018 |
| ES | 2354351 | 3/2011 |
| JP | 2002122820 | 4/2002 |
| JP | 2003195003 | 7/2003 |
| JP | 2003294906 | 10/2003 |
| JP | 2008241746 | 10/2008 |
| JP | 2009179828 | 8/2009 |
| JP | 2010217445 | 9/2010 |
| WO | WO 2008/107325 | 9/2008 |
| WO | WO 2014/193513 | 12/2014 |
| WO | WO 2020/079241 | 4/2020 |

OTHER PUBLICATIONS

International Search Report and Written Opinion issued in corresponding International Application No. PCT/EP2019/078299 dated Jun. 12, 2019.
International Search Report and Written Opinion issued in corresponding International Application No. PCT/EP2019/078406 dated Oct. 3, 2020.
"Standard Test Method for Abrasion Resistance of Transparent Plastics and Coatings Using the Oscillating Sand Method", *Standar ASTM F735-17*, 2017.
Non-Final Office Action issued in corresponding U.S. Appl. No. 17/285,594, dated Mar. 26, 2024.

* cited by examiner

*Primary Examiner* — Lawrence D Ferguson
(74) *Attorney, Agent, or Firm* — Norton Rose Fulbright US LLP

(57) ABSTRACT

The invention relates to an optical article comprising a substrate having at least one main face successively coated with a layer comprising chromium, silicon and oxygen, a monolayer sub-layer having a thickness higher than or equal to 100 nm, a multilayer interferential coating comprising a stack of at least one high refractive index layer having a refractive index higher than 1.55 and at least one low refractive index layer having a refractive index of 1.55 or less, wherein the ratio (I) is higher than or equal to 1.5, and the optical article has a Bayer value determined in accordance with the ASTM F735-81 standard higher than or equal to 7.

$$R_D = \frac{\text{thickness of the outermost low refractive index layer(s) of the interferential coating}}{\text{thickness of the outermost high refractive index layer(s) of the interferential coating}} \quad (I)$$

16 Claims, No Drawings

OPTICAL ARTICLE HAVING AN INTERFERENTIAL COATING WITH AN IMPROVED ABRASION-RESISTANCE

CROSS-REFERENCE TO RELATED APPLICATIONS

This application is a national phase application under 35 U.S.C. § 371 of International Application No. PCT/EP2019/078299 filed 17 Oct. 2019, which claims priority to European Patent Application No. 18306374.2 filed 18 Oct. 2018. The entire contents of each of the above-referenced disclosures is specifically incorporated by reference herein without disclaimer.

The invention relates to an optical article comprising a substrate coated with a multilayer transparent interferential coating, typically an antireflection coating, having an improved abrasion resistance and good adherence properties, in particular an ophthalmic lens, and a method of manufacturing such optical article.

It is a common practice in the art to coat at least one main surface of an optical substrate with several coatings for imparting to the finished article additional or improved optical or mechanical properties. These coatings are designated in general as functional coatings.

The various coatings that may be used to impart a plurality of mechanical and/or optical properties may be impact-resistant coating layers, abrasion- and/or scratch-resistant coating layers, anti-reflection and/or reflective coating layers, and/or anti-fouling layers and/or anti-fog layers.

Different ways to improve the abrasion resistance of an optical article can be found in the literature. For instance, it has been proposed to increase the total thickness of the anti-reflection coating, such as in JP 2003-195003 and JP 2003-294906, where a lens coated with a primer coating, a hard coat and a 7-layer anti-reflection coating comprising alternated layers of $SiO_2$ and $TiO_2$, the latter being deposited with ion assistance and known to be sensitive to photo-degradation, is described.

U.S. Pat. No. 8,982,466 relates to an optical lens having a hard coat and a multilayer anti-reflection coating in which the high-refractive-index layers, made of $TiO_2$, together have a thickness of less than 40 nm.

EP 2775341 discloses an eyeglass lens having a hard coat layer, a 360-390 nm thick $SiO_2$ sub-layer and a 4-layer interferential coating made of $SiO_2$, $ZrO_2$ and/or $Ta_2O_5$, in which the layers have a specific nanoindentation hardness and compressive stress, and have generally been deposited by ion-assisted vapor deposition. This deposition technique increases compressive stress and as a result may lead to delamination.

JP 2002-122820 describes a hard-coated substrate coated with a $SiO_2$ sub-layer having a physical thickness of 89-178 nm (optical thickness: 0.25-0.5λ at 520 nm) and a 4-layer anti-reflection coating ($ZrO_2/SiO_2/ZrO_2/SiO_2$). According to this document, high critical temperatures can be reached by being able to balance coating thickness and stress between the layers of the various materials. However, the only parameter which was studied was the thickness of the sub-layer. Its thickness should be such that the ratio (sum of the physical thicknesses of the $SiO_2$ layers, including the sub-layer)/(sum of the physical thicknesses of the $ZrO_2$ layers) ranges from 2 to 3. Higher ratios are said to be undesirable because the durability of the anti-reflection coating is decreased.

U.S. Pat. No. 7,692,855 discloses an optical article having anti-reflection properties and high thermal resistance, comprising a substrate having at least one main face coated with a multilayer anti-reflection coating in which the ratio of physical thickness of low refractive index layers/high refractive index layers is generally higher than 2.1.

European patent application EP 3392680 suggests the control of the thicknesses of the layers in an interferential coating in order to increase abrasion resistance of an optical article, i.e., the use of a ratio of physical thickness of external low refractive index layer(s)/external high refractive index layer(s) higher than or equal to 2.

EP 1184686 describes an optical element comprising a plastic substrate and, provided thereon in this order, a 1-5 nm thick sub-layer comprising niobium metal (Nb) preferably formed in an ion-assisted process, and an anti-reflection film. Mixtures of niobium with other elements, such as aluminum, chromium and tantalum can also be used. The sub-layer is described as being responsible for high adhesiveness between the plastic substrate and the anti-reflection coating, as well as excellent heat resistance and impact resistance. A $SiO_2$ sub-layer is taught to decrease thermal resistance of the optical element.

An objective of the current invention is to provide a transparent optical article comprising an organic or mineral glass substrate bearing an interferential coating, preferably a lens, and more preferably an ophthalmic lens for eyeglasses, having an improved abrasion resistance, a good adhesion to the substrate and preferably a good resistance to heat and temperature variations, which would be an alternative to already known reflective or antireflective coated optical articles. These properties should be obtained without decreasing the optical performances and other mechanical performances of said article, such as anti-reflection or reflection performances.

Another aim of this invention is to provide a process of manufacturing the above defined article, which could be easily integrated into the classical manufacturing chain and would avoid heating the substrate.

The inventors have found that these objectives could be achieved by using a specific adherence layer, a sub-layer, preferably deposited under specific conditions and having a higher thickness, and selecting a specific ratio of (physical thickness of outermost low refractive index layer(s) of the interferential coating)/(physical thickness of outermost high refractive index layer(s) of the interferential coating). Compared to classical interferential coatings having a low ratio as defined above, inventive interferential coatings have a higher ratio, a better adherence and a higher abrasion resistance.

Thus, the present invention relates to an optical article comprising a substrate having at least one main face successively coated with:

a layer comprising chromium, silicon and oxygen,
a monolayer sub-layer having a thickness higher than or equal to 100 nm,
a multilayer interferential coating comprising a stack of at least one high refractive index layer having a refractive index higher than 1.55 and at least one low refractive index layer having a refractive index of 1.55 or less, wherein the ratio:

$$R_D = \frac{\text{thickness of the outermost low refractive index layer(s) of the interferential coating}}{\text{thickness of the outermost high refractive index layer(s) of the interferential coating}}$$

is higher than or equal to 1.5, and the optical article has a Bayer value determined in accordance with the ASTM F735-81 standard higher than or equal to 7.

DETAILED DESCRIPTION OF THE INVENTION

The terms "comprise" (and any grammatical variation thereof, such as "comprises" and "comprising"), "have" (and any grammatical variation thereof, such as "has" and "having"), "contain" (and any grammatical variation thereof, such as "contains" and "containing"), and "include" (and any grammatical variation thereof, such as "includes" and "including") are open-ended linking verbs. They are used to specify the presence of stated features, integers, steps or components or groups thereof, but do not preclude the presence or addition of one or more other features, integers, steps or components or groups thereof. As a result, a method, or a step in a method, that "comprises," "has," "contains," or "includes" one or more steps or elements possesses those one or more steps or elements, but is not limited to possessing only those one or more steps or elements.

Unless otherwise indicated, all numbers or expressions referring to quantities of ingredients, ranges, reaction conditions, etc. used herein are to be understood as modified in all instances by the term "about."

When an optical article comprises one or more surface coatings, the phrase "to deposit a coating or layer onto the optical article" means that a coating or layer is deposited onto the outermost coating of the optical article, i.e. the coating which is the closest to the air.

A coating that is "on" a side of a lens is defined as a coating that (a) is positioned over that side, (b) need not be in contact with that side, i.e., one or more intervening coatings may be disposed between that side and the coating in question (although it is preferably in contact with that side) and (c) need not cover that side completely.

The term "coating" is understood to mean any layer, layer stack or film, which may be in contact with the substrate and/or with another coating, for example a sol-gel coating or a coating made of an organic resin. A coating may be deposited or formed through various methods, including wet processing, gaseous processing, and film transfer.

The optical article prepared according to the present invention is a transparent optical article, preferably an optical lens or lens blank, and more preferably an ophthalmic lens or lens blank. The optical article may be coated on its convex main face (front side), concave main face (back/rear side), or both faces with the multilayer interferential coating according to the invention, preferably on the convex (front) main face. As used herein, the rear face of the substrate is intended to mean the face which, when using the article, is the nearest from the wearer's eye, in the cases of lenses. It is generally a concave face. On the contrary, the front face of the substrate is the face which, when using the article, is the most distant from the wearer's eye. It is generally a convex face. The optical article can also be a plano article.

Herein, the term "lens" means an organic or inorganic glass lens, comprising a lens substrate, which may be coated with one or more coatings of various natures.

The term "ophthalmic lens" is used to mean a lens adapted to a spectacle frame, for example to protect the eye and/or correct the sight. Said lens can be chosen from afocal, unifocal, bifocal, trifocal and progressive lenses. Although ophthalmic optics is a preferred field of the invention, it will be understood that this invention can be applied to optical articles of other types, such as, for example, lenses for optical instruments, in photography or astronomy, optical sighting lenses, ocular visors, optics of lighting systems, etc.

In the present description, unless otherwise specified, an optical article/material is understood to be transparent when the observation of an image through said optical article is perceived with no significant loss of contrast, that is, when the formation of an image through said optical article is obtained without adversely affecting the quality of the image. This definition of the term "transparent" can be applied to all objects qualified as such in the description, unless otherwise specified.

A substrate, in the sense of the present invention, should be understood to mean an uncoated substrate, and generally has two main faces. The substrate may in particular be an optically transparent material having the shape of an optical article, for example an ophthalmic lens destined to be mounted in glasses. In this context, the term "substrate" is understood to mean the base constituent material of the optical lens and more particularly of the ophthalmic lens. This material acts as support for a stack of one or more coatings or layers.

The substrate may be made of mineral glass or organic glass, preferably organic glass. The organic glasses can be either thermoplastic materials such as polycarbonates and thermoplastic polyurethanes or thermosetting (cross-linked) materials such as diethylene glycol bis(allylcarbonate) polymers and copolymers (in particular CR-39® from PPG Industries), thermosetting polyurethanes, polythiourethanes, preferably polythiourethane resins having a refractive index of 1.60 or 1.67, polyepoxides, polyepisulfides, such as those having a refractive index of 1.74, poly(meth)acrylates and copolymers based substrates, such as substrates comprising (meth)acrylic polymers and copolymers derived from bisphenol-A, polythio(meth)acrylates, as well as copolymers thereof and blends thereof. Preferred materials for the lens substrate are polycarbonates (PC) and diethylene glycol bis(allylcarbonate) polymers, in particular substrates made of polycarbonate.

Specific examples of substrates suitable to the present invention are those obtained from thermosetting polythiourethane resins, which are marketed by the Mitsui Toatsu Chemicals company as MR series, in particular MR6®, MR7® and MR8® resins. These substrates as well as the monomers used for their preparation are especially described in the patents U.S. Pat. Nos. 4,689,387, 4,775,733, 5,059,673, 5,087,758 and 5,191,055.

Prior to depositing the layer comprising chromium, silicon and oxygen, the sub-layer, the interferential coating or other functional coatings, the surface of the article is usually submitted to a physical or chemical surface activating and cleaning pre-treatment, so as to improve the adhesion of the layer to be deposited, such as disclosed in WO 2013/013929. This pre-treatment is generally performed on the surface of an abrasion- and/or scratch-resistant coating (hard coat).

This pre-treatment is generally carried out under vacuum. It may be a bombardment with energetic species, for example an ion beam method ("Ion Pre-Cleaning" or "IPC") or an electron beam method, a corona treatment, an ion spallation treatment, an ultraviolet treatment or a plasma treatment under vacuum, using typically an oxygen or an argon plasma. It may also be an acid or a base surface treatment and/or a solvent surface treatment (using water or an organic solvent) with or without ultrasonic treatment.

Many treatments may be combined. Thanks to these cleaning treatments, the cleanliness of the substrate surface is optimized.

By energetic species, it is meant species with an energy ranging from 1 to 300 eV, preferably from 10 to 150 eV, and more preferably from 10 to 150 eV and most preferably from 40 to 150 eV. Energetic species may be chemical species such as ions, radicals, or species such as photons or electrons.

The interference coating may be virtually any interference coating conventionally used in the field of optics, in particular ophthalmic optics. The interference coating may be, in a non-limiting manner, an anti-reflection coating, a reflective (mirror) coating, an infrared filter or an ultraviolet filter, but is preferably an anti-reflection coating.

An anti-reflection coating is a coating, deposited on the surface of an article, which improves the anti-reflection properties of the final article. It reduces the reflection of light at the article/air interface over a relatively broad portion of the visible spectrum.

The multilayer interferential coating of the invention comprises a stack of at least one high refractive index layer having a refractive index higher than 1.55 and at least one low refractive index layer having a refractive index of 1.55 or less.

More preferably, it comprises at least two layers with a low refractive index (LI) and at least two layers with a high refractive index (HI). The total number of layers in the interferential coating is preferably higher than or equal to 3, more preferably higher than or equal to 4, and preferably lower than or equal to 7, more preferably lower than or equal to 6, even more preferably lower than or equal to 5, and most preferably equal to 5 layers.

As used herein, a layer of the interferential coating is defined as having a thickness higher than or equal to 1 nm. Thus, any layer having a thickness lower than 1 nm will not be considered when counting the number of layers in the interferential coating. The layer comprising chromium, silicon and oxygen, sub-layer and optional impedance layers either are not considered when counting the number of layers of the interferential coating or when indicating its thickness.

HI layers and LI layers do not necessarily alternate with each other in the stack, although they also may, according to one embodiment of the invention. Two HI layers (or more) may be deposited onto each other, as well as two LI layers (or more) may be deposited onto each other.

In the present application, a layer of the interferential coating is said to be a layer with a high refractive index (HI) when its refractive index is higher than 1.55, preferably higher than or equal to 1.6, even more preferably higher than or equal to 1.8 or 1.9 and most preferably higher than or equal to 2. Said HI layers preferably have a refractive index lower than or equal to 2.2 or 2.1. A layer of an interferential coating is said to be a low refractive index layer (LI) when its refractive index is lower than or equal to 1.55, preferably lower than or equal to 1.52, more preferably lower than or equal to 1.48 or 1.47. Said LI layer preferably has a refractive index higher than or equal to 1.1.

The HI layer generally comprises one or more metal oxides such as, without limitation, zirconia ($ZrO_2$), titanium dioxide ($TiO_2$), alumina ($Al_2O_3$), tantalum pentoxide ($Ta_2O_5$), neodymium oxide ($Nd_2O_5$), praseodymium oxide ($Pr_2O_3$), praseodymium titanate ($PrTiO_3$), $La_2O_3$, $Nb_2O_5$, $Y_2O_3$, with the proviso that $TiO_2$ is not present in the outermost high refractive index layer(s) of the interferential coating. In some aspects of the invention, the outermost high refractive index layer(s) of the interferential coating do(es) not comprise titanium oxide. In a preferred embodiment, the interferential coating does not comprise any layer comprising $TiO_2$, or more generally, titanium oxide. As used herein, titanium oxide is intended to mean titanium dioxide or a substoichiometric titanium oxide (TiOx, where x<2). Titanium oxide-containing layers are indeed sensitive to photodegradation.

Optionally, the HI layers may further contain silica or other materials with a low refractive index, provided they have a refractive index higher than 1.55 as indicated hereabove. The preferred materials include $ZrO_2$, $PrTiO_3$, $Nb_2O_5$, $Ta_2O_5$, $Y_2O_3$ and mixtures thereof.

The LI layer is also well known and may comprise, without limitation, $SiO_2$, $MgF_2$, or a mixture of silica and alumina, especially silica doped with alumina, the latter contributing to increase the interferential coating thermal resistance. The LI layer is preferably a layer comprising at least 80% by weight of silica, more preferably at least 90% by weight of silica, relative to the layer total weight, and even more preferably consists in a silica layer.

Optionally, the LI layers may further contain materials with a high refractive index, provided the refractive index of the resulting layer is lower than or equal to 1.55.

When a LI layer comprising a mixture of $SiO_2$ and $Al_2O_3$ is used, it preferably comprises from 1 to 10%, more preferably from 1 to 8% and even more preferably from 1 to 5% by weight of $Al_2O_3$ relative to the $SiO_2+Al_2O_3$ total weight in such layer.

For example, $SiO_2$ doped with 4% $Al_2O_3$ by weight, or less, or $SiO_2$ doped with 8% $Al_2O_3$ may be employed. $SiO_2/Al_2O_3$ mixtures, that are available on the market may be used, such as LIMA® marketed by the Umicore Materials AG company (refractive index n=1.48-1.50 at 550 nm), or L5® marketed by the Merck KGaA company (refractive index n=1.48 at 500 nm).

The interferential coating external layer, i.e., its layer that is the furthest from the substrate is generally a silica-based layer, comprising preferably at least 80% by weight of silica, more preferably at least 90% by weight of silica (for example a silica layer doped with alumina), relative to the layer total weight, and even more preferably consists of a silica layer.

Generally, the HI and LI layers have a physical thickness ranging from 10 to 120 nm, preferably from 20 to 110 nm.

Generally, the total thickness of the interferential coating plus the thickness of the sub-layer plus the thickness of the layer comprising chromium, silicon and oxygen plus the thickness of the impedance layers (defined later in this application) if present is lower than 1 micrometer, preferably lower than or equal to 800 nm, more preferably lower than or equal to 500 nm and even more preferably lower than or equal to 450 nm. The interferential coating total thickness is generally higher than 100 nm, preferably higher than 200 nm.

The $R_D$ ratio of the present interferential coating is higher than or equal to 1.5, and preferably higher than or equal to any one of the following values: 1.6, 1.7, 1.8, 1.9, 2.0, 2.05, 2.1, 2.15, 2.2, 2.25, 2.3, 2.35, 2.4, 2.5, 2.6, 2.7, 2.75, and 2.8. $R_D$ is defined as:

$$R_D = \frac{\text{thickness of the outermost low refractive index layer(s) of the interferential coating}}{\text{thickness of the outermost high refractive index layer(s) of the interferential coating}}$$

By outermost high or low refractive index layer(s) of the interferential coating, it is meant the layer(s) of the interferential coating that is (are) the furthest from the substrate. Generally, there is only one outermost high (or low) refractive index layer in the interferential coating, i.e., when high refractive index layers and low refractive index layers alternate with each other in the stack. However, in some embodiments, there can be two or more adjacent high (or low) refractive index layers in outermost position in the interferential coating. In this case, it is considered that there is a plurality of outermost high (or low) refractive index layers in the interferential coating, and this is taken into account by adding their respective thicknesses for the calculation of the $R_D$ ratio.

When a high refractive index layer of the interferential coating is an electrically conductive layer, especially a conductive oxide layer (such as an ITO, $SnO_2$ layer) and is positioned as the outermost high refractive index layer but is not adjacent to one or more non conductive high refractive index layers (such as a $ZrO_2$, $Ta_2O_5$ layer), such high refractive index conductive layer is not taken into account for the calculation of $R_D$ and is not considered as being part of the interferential coating.

As an example, for an interferential coating comprising the following layers: Air/hydrophobic coating/$SiO_2$ (thickness a)/ITO (thickness b)/$SiO_2$ (thickness c)/$ZrO_2$ (thickness d)/$SiO_2$ . . . , $R_D$=(a+c)/d.

The thicknesses of the two $SiO_2$ layers are added, as the conductive layer is not considered as being part of the coating. Consequently, the above defined general rules for the calculation are applied.

However, if the conductive layer identified as the outermost high refractive index layer is adjacent to one or more non conductive high refractive index layer(s) (plurality of adjacent high refractive index layers), the thicknesses of those plurality of high refractive index layers are added for the calculation of the $R_D$ ratio.

As an example, for an interferential coating comprising the following layers Air/hydrophobic coating/$SiO_2$(thickness a')/ITO(thickness b')/$ZrO_2$(thickness c')/$SiO_2$ . . .

$$R_D=a'/(b'+c')$$

It is to be noted that such high refractive index conductive layer (such as ITO or $SnO_2$) is generally thin or very thin (typically less than any one of the following thickness values: 20 nm, 15 nm, 10 nm).

In the present invention, the interferential coating is designed with a ratio $R_D$ as high as possible so as to increase the resistance to abrasion of the optical article. Indeed, a relationship has been established between abrasion resistance and the ratio $R_D$ mentioned above. The inventors have found that limiting the thickness of the outermost layer(s) of high refractive index materials and/or increasing the thickness of the outermost layer(s) of low refractive index materials was beneficial to the abrasion resistance of the optical article. A standard Bayer abrasion test can be used to determine the abrasion resistance of the optical article.

Moreover, the optical article has a good resistance to heat and temperature variations, i.e., a high critical temperature, as defined in the experimental section. The critical temperature of an article coated according to the invention is preferably ≥50° C., more preferably ≥60° C.

It is also possible to define a $R_T$ ratio, which is identical to the $R_T$ ratio defined in U.S. Pat. No. 7,692,855:

$$R_T = \frac{\text{sum of the physical thicknesses of the low refractive index layers of the anti-reflection coating}}{\text{sum of the physical thicknesses of the high refractive index layers of the anti-reflection coating}}$$

with the proviso that the layers of the antireflection coating taken into account for the calculation of said ratio $R_T$ are only the layers located above the low refractive index layer (n≤1.55) having a physical thickness ≥100 nm and not being the outermost layer of the antireflection coating which is the furthest from the substrate, when the antireflection coating comprises at least one low refractive index layer having a physical thickness ≥100 nm which is not the layer of the antireflection coating that is the furthest from the substrate.

The ratio $R_T$ is calculated on the whole antireflection coating unless at least one inner LI layer (i.e., not the LI layer that is the furthest from the substrate) having a thickness of 100 nm or more is present in the antireflection stack. Actually, if a high thickness LI layer (higher than 100 nm) is present inside the antireflection coating, it may block the propagation of cracks. In this case, the ratio $R_T$ has to be calculated on the upper part of the stack, i.e., without taking into account said high thickness LI layer and the layers lying under. If several high thickness LI layers are present, $R_T$ is calculated on the part of the stack located above the thick low refractive index layer having a physical thickness ≥100 nm and not being the outermost layer of the anti-reflection coating which is the furthest from the substrate.

In one embodiment $R_T$ is higher than or equal to 0.8, preferably higher than or equal to 1, 1.5, 1.9, 2, 2.2, 2.5, 3 or 3.4. In one embodiment, $R_T$ is lower than 5, preferably lower than at least one of the following values 4.5, 4.0, 3.5. In another embodiment, $R_T$ ranges from 0.8 to 3.5. It is preferable to have a high $R_T$ ratio, in order to have an article showing a higher critical temperature, while exhibiting in the same time high abrasion resistance.

It is also possible to define a R1 ratio:

R1=thickness of the outermost internal low refractive index layer(s) of the interferential coating/ thickness of the outermost internal high refractive index layer(s) of the interferential coating By outermost internal high or low refractive index layer(s) of the interferential coating, it is meant the layer(s) of the interferential coating that is (are) the furthest from the substrate but positioned just before the outermost low and high refractive index layer(s) of the interferential coating as defined previously. Generally, there is only one internal outermost high (or low) refractive index layer in the interferential coating, i.e., when high refractive index layers and low refractive index layers alternate with each other in the stack. However, in some embodiments, there can be two or more adjacent high (or low) refractive index layers in internal outermost position in the interferential coating. In this case, it is considered that there is a plurality of outermost high (or low) refractive index layers in the interferential coating, and this is taken into account by adding their respective thicknesses for the calculation of the R1 ratio.

When a high refractive index layer of the interferential coating is an electrically conductive layer, especially a conductive oxide layer (such as an ITO, $SnO_2$ layer) and is positioned as the outermost internal high refractive index layer but is not adjacent to one or more non conductive high refractive index layers (such as a $ZrO_2$, $Ta_2O_5$ layer), such conductive layer is not taken into account for the calculation of R1 and is not considered as being part of the interferential coating.

As an example, for an interferential coating comprising the following layers: Air/hydrophobic coating/ . . . /SiO$_2$ (thickness a")/ITO (thickness b")/SiO$_2$ (thickness c")/ZrO$_2$ (thickness d")/SiO$_2$ . . . , R1=(a"+c")/d".

The thicknesses of the two internal SiO$_2$ layers are added, as the conductive layer is not considered as being part of the coating. Consequently, the above defined rules for the calculation are applied.

However, if the high refractive index conductive layer identified as the outermost internal layer is adjacent to one or more non conductive high refractive index layer (plurality of adjacent high refractive index layers), the thicknesses of those plurality of layers are added for the calculation of the R1 ratio.

As an example, for an interferential coating comprising the following layers Air/ . . . /SiO$_2$(thickness a''')/ITO (thickness b''')/ZrO$_2$(thickness c'''/SiO$_2$) . . . R1=a'''/(b'''+c''').

It is to be noted that such high refractive index conductive layer (such as ITO or SnO$_2$) is generally thin or very thin (typically less than one of the following thickness values: 20 nm, 15 nm, 10 nm).

In an embodiment R1 is higher than or equal to 1.3, preferably higher than or equal to 1.4. In an embodiment, R1 is lower than 3.5, preferably lower than at least one of the following values 3, 2.5, 2.0, 1.5. Those values provide a good compromise of properties. In another embodiment, R1 ranges from 1.2 to 2.

In the present invention, the multilayer interferential coating is deposited onto a monolayer sub-layer having a thickness higher than or equal to 100 nm. It should be noted that such sub-layer does not belong to the interferential coating. Said sub-layer in preferably in direct contact with the interferential coating.

As used herein, an interferential coating sub-layer or adhesion layer is intended to mean a relatively thick coating, used in order to improve mechanical properties such as abrasion resistance and/or scratch resistance of the interferential coating and/or so as to reinforce its adhesion to the substrate or to the underlying coating.

Because of its relatively high thickness, the sub-layer does generally not take part to the reflective or anti-reflective optical activity of the interferential coating, especially when it has a refractive index close to that of the underlying coating (which is generally the layer comprising chromium, silicon and oxygen).

The sub-layer has a thickness that is generally lower than or equal to any one of the following values: 500 nm, 400 nm, 355 nm, 300 nm and is preferably lower than 200 nm, and is generally higher than or equal to 110 nm, more preferably higher than or equal to 120, 130 or 150 nm. Increasing the thickness of the sub-layer leads to an abrasion resistance improvement.

The sub-layer is preferably a SiO$_2$-based layer, this layer comprising preferably at least 80% by weight of silica, more preferably at least 90% by weight of silica, relative to the layer total weight, and even more preferably consists of a silica layer. In another embodiment, this SiO$_2$-based layer is a silica layer doped with alumina, in amounts such as defined hereabove, preferably consists of a silica layer doped with alumina.

When designing an interference stack according to the invention, mechanical stresses are properties to be taken into account. The stress in the sub-layer is preferably negative, i.e., the sub-layer is under compression. This compressive stress is preferably lower than −250 MPa, more preferably lower than any one of the following values: −275 MPa, −290 MPa, −300 MPa, −350 MPa, −400 MPa, −450 MPa. It is preferably higher than −500 MPa. It is measured at a temperature of 20° C. and under a relative humidity of 50% in the manner described in WO 2014/199103. The deposition conditions, in particular the pressure during the deposition of the sub-layer, allow these stress values to be achieved. The stress is measured for a thickness of the sub-layer of at least 150 nm, preferably at a thickness of the sub-layer of around 150 nm.

Especially, when deposited on a layer comprising chromium, silicon and oxygen, the sublayer has a higher compressive stress. When the sub-layer is deposited on a layer comprising chromium, silicon and oxygen, the stress measurement gives the value for the whole stack (layer comprising chromium, silicon and oxygen+sub-layer). By convention, this value will be assimilated to the stress of the sub-layer.

In the present invention, the monolayer sub-layer is deposited onto a thin layer comprising chromium, silicon and oxygen, having preferably a thickness lower than or equal to 10 nm, more preferably ranging from 1 to 8 nm, most preferably from 1 to 5 nm. It should be noted that such layer does not belong to the interferential coating. It is preferably in direct contact with the interferential coating.

The refractive index of the layer comprising chromium, silicon and oxygen is preferably higher than 1.55.

The layer comprising chromium, silicon and oxygen is used as an adherence layer to ensure adhesion between the sub-layer and the underlying coating or the substrate. Indeed, adhesion problems can be observed when the means according to the invention are implemented to improve the abrasion resistance of the optical article, such as increasing the thickness of the sub-layer and/or depositing the sub-layer under a low pressure, preferably without additional gas supply, so as to increase its compression.

The layer comprising chromium, silicon and oxygen preferably comprises chromium and a silicon oxide such as SiO or SiO$_2$, more preferably chromium and silicon dioxide (SiO$_2$). Said layer preferably comprises from 50 to 95% by weight of silicon oxides (preferably silicon dioxide), more preferably from 65 to 92% by weight, most preferably from 80 to 90% by weight. Said layer preferably comprises from 5 to 50% by weight of chromium, more preferably from 8 to 35% by weight, most preferably from 10 to 20% by weight. Examples of commercially available materials that can be used to form said layer comprising chromium, silicon and oxygen are the materials Malbunit 8/1 (mixture of SiO$_2$ and Cr) and Flexo (mixture of SiO and Cr), provided by the Umicore Materials AG company.

In some embodiments of the invention, especially when the layer comprising chromium, silicon and oxygen and the underlying coating (or the substrate, if there is no functional coating between the substrate and said layer) have substantially different refractive indexes, one or more so-called "impedance layers" (or optical buffer layers or optical adjustment layers) can be interleaved between the sub-layer and the layer comprising chromium, silicon and oxygen, the impedance layers limiting interference fringes due to differences of refractive indices between the layer comprising chromium, silicon and oxygen and the sub-layer.

In this case, the optical article may comprise preferably at most three additional layers, more preferably at most two additional layers, interleaved between the optionally coated substrate and the layer comprising chromium, silicon and oxygen. These additional/intermediate layers are preferably thin layers, the function of which is to limit the reflections at the layer comprising chromium, silicon and oxygen/underlying coating interface or layer comprising chromium, silicon and oxygen/substrate interface, as the case may be, by interferential effect.

In one embodiment, the impedance coating comprises, preferably consists of, a layer with a high refractive index and with a thickness lower than or equal to 80 nm, more preferably lower than or equal to 50 nm and most preferably lower than or equal to 30 or 20 nm. Such layer with a high refractive index is preferably in direct contact with the substrate with a high refractive index or the underlying coating with a high refractive index, as appropriate. Of course, this embodiment may be used even if the substrate (or the underlying coating) has a refractive index lower than or equal to 1.55.

As an alternative, the impedance coating comprises, in addition to the previously mentioned layer with a high refractive index, a $SiO_2$-based layer made of a material (that is to say comprising preferably at least 80% by weight of silica) with a refractive index lower than or equal to 1.55, preferably lower than or equal to 1.52, more preferably lower than or equal to 1.50, and with a thickness lower than or equal to 80 nm, more preferably lower than or equal to 50 nm and even more preferably lower than or equal to 45 nm, onto which said layer with a high refractive index is deposited. Typically, in this instance, the impedance coating comprises, deposited in this order onto the optionally coated substrate, a 4-50 nm-thick $SiO_2$ layer, and a 4-15 nm-thick $ZrO_2$ or $Ta_2O_5$ layer, which is in contact with the layer comprising chromium, silicon and oxygen.

Optionally, the exposed surface of the sub-layer may be submitted, prior to depositing the first layer of the interferential coating, to a physical or a chemical activation treatment which may be selected from the pre-treatments the substrate may undergo prior to depositing the layer comprising chromium, silicon and oxygen and which have already been mentioned hereabove. The preferred pre-treatment is an ion bombardment, for example by using an ion gun-generated argon ion beam. Such physical or chemical activation treatments (preferably an ionic bombardment treatment) may also be performed on the exposed surface of one or more layer(s) of the multilayer interference coating, prior to depositing the subsequent layer of said multilayer interferential coating.

The optical article of the invention may be made antistatic, that is to say not to retain and/or develop a substantial static charge, by incorporating at least one electrically conductive layer into the stack present on the surface of the article, preferably in the interferential coating.

The ability for a lens to evacuate a static charge obtained after rubbing with a piece of cloth or using any other procedure to generate a static charge (charge applied by corona . . . ) may be quantified by measuring the time it takes for said charge to dissipate. Thus, antistatic lenses have a discharge time of about a few hundred milliseconds, preferably 500 ms or less, whereas it is of about several tens of seconds for a static lens. In the present application, discharge times are measured according to the method exposed in the French application FR 2943798.

As used herein, an "electrically conductive layer" or an "antistatic layer" is intended to mean a layer which, due to its presence on the surface of a substrate, decreases the ability of the optical article to attract dust/particles due to charge accumulation. Preferably, when applied onto a non-antistatic substrate (i.e. having a discharge time higher than 500 ms), the antistatic layer enables the optical article not to retain and/or develop a substantial static charge, for example to have a discharge time of 500 ms or less after a static charge has been applied onto the surface thereof, so that small dust is prevented from adhering to the optical article due to prevention of static effects.

The electrically conductive layer may be located at various places in the stack, generally in or in contact with the interferential coating, provided that the reflective or anti-reflective properties thereof are not affected. It is preferably located between two layers of the interferential coating, and/or is preferably adjacent to a layer with a high refractive index of such interferential coating. In an embodiment, the electrically conductive layer is located immediately under a layer with a low refractive index of the interferential coating, most preferably is the penultimate layer of the interferential coating by being located immediately under the LI external layer of the interferential coating.

The electrically conductive layer should be thin enough not to alter the transparency of the interferential coating. The electrically conductive layer is preferably made from an electrically conductive and highly transparent material, generally an optionally doped metal oxide. In this case, the thickness thereof preferably ranges from 1 to 15 nm, more preferably from 1 to 10 nm, ideally from 2 to 8 nm. Preferably, the electrically conductive layer comprises an optionally doped metal oxide, selected from indium, tin, zinc oxides and mixtures thereof. Tin-indium oxide ($In_2O_3$: Sn, tin-doped indium oxide), aluminum-doped zinc oxide (ZnO:Al), indium oxide ($In_2O_3$) and tin oxide ($SnO_2$) are preferred. In a most preferred embodiment, the electrically conductive and optically transparent layer is a tin-indium oxide layer, noted ITO layer or a tin oxide layer.

Generally, the electrically conductive layer contributes, within the stack, but in a limited manner because of its low thickness, to obtaining interferential properties and typically represents a layer with a high refractive index in said coating. This is the case for those layers made from an electrically conductive and highly transparent material such as ITO or $SnO_2$ layers. Accordingly, when it is present, the electrically conductive layer is preferably the outermost high refractive index layer of the interferential coating, or one of the outermost high refractive index layers of the interferential coating when it is adjacent to one or more high refractive index layers.

The electrically conductive layer may be deposited according to any suitable method, for example by vacuum evaporation deposition, preferably ion-beam-assisted (IAD, described below) to increase its transparence, or by means of cathode sputtering.

The electrically conductive layer may also be a very thin layer of a noble metal (Ag, Au, Pt, etc.) typically smaller than 1 nm in thickness and preferably less than 0.5 nm in thickness.

The various layers of the interferential coating, the sub-layer, the layer comprising chromium, silicon and oxygen and the optional impedance layers are preferably deposited by vapor phase deposition, under vacuum, according to any of the following methods: i) by evaporation, optionally under ion beam assistance; ii) by ion-beam spraying; iii) by cathode sputtering; iv) by plasma-assisted chemical vapor deposition. These various methods are described in the following references "Thin Film Processes" and "Thin Film Processes II," Vossen & Kern, Ed., Academic Press, 1978 and 1991, respectively. A particularly recommended method is evaporation under vacuum. Preferably, the deposition of each of the above-mentioned layers is conducted by evaporation under vacuum. Such a process does advantageously avoid heating the substrate, which is particularly interesting for coating heat-sensitive substrates such as organic glasses.

A treatment step with energetic species such as previously defined may also be carried out, simultaneously whilst depositing one or more of the various layers of the interference coating, sub-layer, layer comprising chromium, silicon and oxygen or optional impedance layers. In particular, working under ion assistance enables to pack said layers while they are being formed, and increases their compression and refractive index. The use of ion assistance during the deposition of a layer produces a layer that is structurally different from a layer deposited without ion assistance.

The ion assisted deposition method or IAD is notably described in US patent application 2006/017011 and in U.S. Pat. No. 5,268,781. Vapor phase deposition under ion assistance comprises depositing onto a substrate a layer of material by simultaneously bombarding by means of an ion beam said layer while it is being formed, and preferably under ion bombardment achieved by means of an ion gun. The ion bombardment leads to an atomic rearrangement in the coating being formed, which increases its density. The IAD not only allows an improvement of the deposited layer adhesion, but also an increase in their refractive index. The IAD operation may be performed by means of an ion gun, where ions are particles composed of gas atoms from which one or more electron(s) is or are extracted. It does preferably consist of bombarding the surface to be treated with oxygen ions. Other ionized gases may be used, either combined with oxygen, or not, for example argon, nitrogen, in particular a mixture of $O_2$ and argon according to a volume ratio ranging from 2:1 to 1:2.

The outermost low refractive index layer(s) of the interferential coating is (are) preferably deposited without ionic assistance, preferably without concomitant treatment with energetic species. In another embodiment, the low refractive index layers of the interferential coating and/or the sub-layer and/or the layer comprising chromium, silicon and oxygen are deposited without ionic assistance, preferably without concomitant treatment with energetic species. In another embodiment, the outermost high refractive index layer(s) of the interferential coating is (are) deposited without ionic assistance (preferably without concomitant treatment with energetic species), except the electrically conductive layer(s), if present in the outermost position. In a further embodiment, no layer of the interferential coating is deposited under ion assistance (preferably no layer of the interferential coating is deposited under concomitant treatment with energetic species), except the electrically conductive layer(s), if present in the interferential coating.

Optionally, the deposition of one or more of said layers is performed by supplying (a supplementary) gas during the deposition step of the layer in a vacuum chamber, such as disclosed in US 20080213473. Concretely, an additional gas such as a rare gas, for example argon, krypton, xenon, neon; a gas such as oxygen, nitrogen, or mixtures of two gases or more amongst these, is or are introduced into the vacuum deposition chamber while the layer is being deposited. The gas employed during this deposition step is not an ionized gas, more preferably not an activated gas.

This gas supply makes it possible to regulate the pressure and differs from an ionic bombardment treatment, such as ion assistance. It generally enables the limitation of stress in the interferential coating and to reinforce the adhesion of the layers. When such deposition method is used, which is called deposition under gas pressure regulation, it is preferred to work under an oxygen atmosphere (so called "passive oxygen"). The use of an additional gas supply during the deposition of a layer produces a layer that is structurally different from a layer deposited without additional gas supply.

In an embodiment of the invention, the deposition of the sub-layer is performed in a vacuum chamber under a pressure lower than $1.6\times10^{-4}$ mBar, preferably lower than $10^{-4}$ mBar, more preferably lower than $8\cdot10^{-5}$ mBar.

In an embodiment of the invention, the deposition of the sub-layer is performed in a vacuum chamber under a pressure lower than any one of the following values $1.6\times10^{-4}$ mBar, $1.5\times10^{-4}$ mBar, $1.4\times10^{-4}$ mBar, $1.3\times10^{-4}$ mBar, $1.2\times10^{-4}$ mBar, $1.1\times10^{-4}$ mBar, preferably lower than $10^{-4}$ mBar, more preferably lower than $8\cdot10^{-5}$ mBar and even better lower than any one of the following values $7\cdot10^{-5}$ mBar, $6\cdot10^{-5}$ mBar, $5\cdot10^{-5}$ mBar.

In a preferred embodiment of the invention, the deposition of the sub-layer is performed in a vacuum chamber in which no supplementary gas is supplied during said deposition. It has been found that depositing the sub-layer under a low pressure, and ideally without gas supply to obtain a still lower pressure, leads to a sub-layer with a lower porosity, a higher compression and density, and an increase of the abrasion resistance of the optical article.

In another embodiment, the outermost high refractive index layer(s) of the interferential coating, except the electrically conductive layer(s), if present in outermost position, is (are) deposited in a vacuum chamber in which at least one supplementary gas is supplied during said deposition. In another embodiment, the high refractive index layer(s) of the interferential coating, except the electrically conductive layer(s), if present in outermost position, is (are) deposited in a vacuum chamber in which at least one supplementary gas is supplied during said deposition.

According to a particularly preferred embodiment, the optical article comprises, starting from the surface of the substrate optionally coated with one or more functional coatings such as a primer coating and/or a hard coat, a layer comprising chromium, silicon and oxygen having preferably a thickness ranging from 1 to 10 nm, a sub-layer having a thickness of from 100 to 300 nm, more preferably from 100 to 200 nm, even more preferably from 100 to 170 nm, preferably a silica-based sub-layer, and an interferential coating, preferably an anti-reflective coating, containing in the following order, a high refractive index layer with a thickness of from 8 to 35 nm, preferably of from 20 to 30 nm, preferably of zirconia, a layer with a low refractive index with a thickness of from 30 to 50 nm, preferably of from 32 to 42 nm, preferably of silica, a layer with a high refractive index with a thickness of from 30 to 50 nm, preferably of from 37 to 47 nm, preferably of zirconia, optionally an electrically conductive layer with a thickness of from 3 to 15 nm, preferably of from 4 to 8 nm, preferably made of tin oxide, and a layer with a low refractive index with a thickness of from 80 to 120 nm, preferably of from 90 to 110 nm, preferably of silica.

The interferential coating/sub-layer/layer comprising chromium, silicon and oxygen/optional impedance layer(s) system may be deposited directly onto a bare substrate. In some applications, it is preferred that the main surface of the substrate be coated with one or more functional coatings improving its optical and/or mechanical properties, prior to depositing the interferential coating of the invention. These functional coatings traditionally used in optics may be, without limitation, an impact-resistant primer layer, an abrasion- and/or scratch-resistant coating (hard coat), a polarized coating, an antistatic coating, a photochromic coating, a tinted coating or a stack made of two or more of such coatings.

The impact-resistant primer coating which may be used in the present invention can be any coating typically used for improving impact resistance of a finished optical article. By definition, an impact-resistant primer coating is a coating which improves the impact resistance of the finished optical article as compared with the same optical article but without the impact-resistant primer coating.

Typical impact-resistant primer coatings are (meth)acrylic based coatings and polyurethane based coatings. In particular, the impact-resistant primer coating according to the invention can be made from a latex composition such as a poly(meth)acrylic latex, a polyurethane latex or a polyester latex.

Preferred primer compositions include compositions based on thermoplastic polyurethanes, such as those described in the patents JP 63-141001 and JP 63-87223, poly(meth)acrylic primer compositions, such as those described in the patents U.S. Pat. Nos. 5,015,523 and 6,503,631, compositions based on thermosetting polyurethanes, such as those described in the patent EP 0404111 and compositions based on poly(meth)acrylic latexes or polyurethane latexes, such as those described in the patents U.S. Pat. No. 5,316,791 and EP 0680492. Preferred primer compositions are compositions based on polyurethanes and compositions based on latexes, in particular polyurethane latexes, poly(meth)acrylic latexes and polyester latexes, as well as their combinations. In one embodiment, the impact-resistant primer comprises colloidal fillers.

Poly(meth)acrylic latexes are latexes based on copolymers essentially made of a (meth)acrylate, such as for example ethyl (meth)acrylate, butyl (meth)acrylate, methoxyethyl (meth)acrylate or ethoxyethyl (meth)acrylate, with at least one other co-monomer in a typically lower amount, such as for example styrene.

Commercially available primer compositions suitable for use in the invention include the Witcobond® 232, Witcobond® 234, Witcobond® 240, Witcobond® 242 compositions (marketed by BAXENDEN CHEMICALS), Neorez® R-962, Neorez® R-972, Neorez® R-986 and Neorez® R-9603 (marketed by ZENECA RESINS), and Neocryl® A-639 (marketed by DSM coating resins).

The thickness of the impact-resistant primer coating, after curing, typically ranges from 0.05 to 30 μm, preferably 0.2 to 20 μm and more particularly from 0.5 to 10 μm, and even better 0.6 to 5 μm or 0.6 to 3 μm, and most preferably 0.8 to 1.5 microns.

The impact-resistant primer coating is preferably in direct contact with an abrasion- and/or scratch-resistant coating.

The abrasion- and/or scratch-resistant coating may be any layer traditionally used as an anti-abrasion and/or anti-scratch coating in the field of optical lenses.

The abrasion- and/or scratch-resistant coatings are preferably hard coatings based on poly(meth)acrylates or silanes, generally comprising one or more mineral fillers intended to increase the hardness and/or the refractive index of the coating once cured.

Abrasion- and/or scratch-resistant coatings are preferably prepared from compositions comprising at least one alkoxysilane and/or a hydrolyzate thereof, obtained for example through hydrolysis with a hydrochloric acid solution and optionally condensation and/or curing catalysts.

Suitable coatings that are recommended for the present invention include coatings based on epoxysilane hydrolyzates such as those described in the patents EP 0614957, U.S. Pat. Nos. 4,211,823 and 5,015,523.

A preferred abrasion- and/or scratch-resistant coating composition is the one disclosed in the patent EP 0614957, in the name of the applicant. It comprises a hydrolyzate of epoxy trialkoxysilane and dialkyl dialkoxysilane, colloidal silica and a catalytic amount of an aluminum-based curing catalyst such as aluminum acetylacetonate, the rest being essentially composed of solvents traditionally used for formulating such compositions. Preferably, the hydrolyzate used is a hydrolyzate of γ-glycidoxypropyltrimethoxysilane (GLYMO) and dimethyldiethoxysilane (DMDES).

The abrasion- and/or scratch-resistant coating composition may be deposited by known methods and is then cured, preferably using heat or ultraviolet radiation. The thickness of the (cured) abrasion- and/or scratch-resistant coating does generally vary from 2 to 10 μm, preferably from 3 to 5 μm.

The optical article according to the invention may also comprise coatings formed on the interferential coating and capable of modifying the surface properties thereof, such as a hydrophobic and/or oleophobic coating (antifouling top coat). These coatings are preferably deposited onto the outer layer of the interferential coating. Generally, their thickness is lower than or equal to 10 nm, does preferably range from 1 to 10 nm, more preferably from 1 to 5 nm. Antifouling top coats are generally coatings of the fluorosilane or fluorosilazane type, preferably comprising fluoropolyether moieties and more preferably perfluoropolyether moieties. More detailed information on these coatings is disclosed in WO 2012076714.

Instead of a hydrophobic coating, a hydrophilic coating may be used which provides anti-fog properties (anti-fog coating), or a precursor of an anti-fog coating which provides anti-fog properties when associated with a surfactant. Examples of such anti-fog precursor coatings are described in the patent application WO 2011/080472.

The additional coatings such as primers, hard coats and antifouling top coats may be deposited onto a main face of the substrate using methods known in the art, including spin-coating, dip-coating, spray-coating, evaporation, sputtering, chemical vapor deposition and lamination.

Typically, an optical article according to the invention comprises a substrate that is successively coated with an impact-resistant primer layer, an anti-abrasion and/or scratch-resistant layer, a layer comprising chromium, silicon and oxygen, a sub-layer, an interferential coating according to the invention, and a hydrophobic and/or oleophobic coating, or a hydrophilic coating which provides anti-fog properties, or an anti-fog precursor coating.

Due to the presence of the sub-layer and interferential coating according to the invention (as an example an anti-reflective coating), the optical articles of the invention exhibit a high value of abrasion resistance measured according to the Bayer ASTM (Bayer sand) operating protocol described hereafter, i.e., in accordance with the ASTM F735-81 standard.

According to the present invention, the optical article, the main face of which, preferably the front face, is covered by the interferential stack of the invention, exhibits a Bayer value measured in accordance with the ASTM F735-81 standard higher than 7, preferably higher than any one of the following value: 7.5, 8, 8.5, 9, 9.5, 10, 10.5, 11. Thus, the present invention provides optical articles with a high abrasion resistance, since typical sand Bayer values for optical articles are around 5. Such values can be obtained by controlling the $R_D$ ratio, the thickness of the sub-layer and/or the deposition parameters, in particular the pressure during the deposition of the sub-layer.

In an embodiment, the optical article is an ophthalmic lens comprising a substrate having at least one main face successively coated with:
- a layer comprising chromium, silicon and oxygen,
- a monolayer sub-layer having a thickness higher than or equal to 100 nm,
- a multilayer interferential coating, preferably an antireflective coating, comprising a stack of at least one high refractive index layer having a refractive index higher than 1.55 and at least one low refractive index layer having a refractive index of 1.55 or less, wherein:

the ratio:

$$R_D = \frac{\text{thickness of the outermost low refractive index layer(s) of the interferential coating}}{\text{thickness of the outermost high refractive index layer(s) of the interferential coating}}$$

is higher than or equal to 1.5, the optical article has a Bayer value determined in accordance with the ASTM F735-81 standard higher than or equal to 7, and the interferential coating is applied on the front main face of the ophthalmic lens.

In a preferred embodiment, the front main face of the ophthalmic lens according to the invention as defined before exhibits a Bayer value V1 and the back (concave) main face of said lens is coated by an interferential coating, preferably an antireflective coating, different from that of the front main face and that exhibits a Bayer value V2, V1 and V2 satisfying the following relationship:

V1-V2 is higher than 0.5, preferably higher than 1, more preferably higher than 1.5, even better higher than at least one of the following values: 2; 2.5; 3; 3.5; 4, and V1 is higher than or equal to 7, more preferably higher than or equal to 8. V1 and V2 are measured in accordance with the ASTM F735-81 standard.

The Bayer values being measurable only on a convex surface, the interferential coating on the back main face has to be reproduced on a convex surface on a separate lens, and its Bayer value measured according to the same protocol as the front face in order to obtain the V2 value. The back main face may also comprise a sub-layer and/or a layer comprising chromium, silicon and oxygen, as defined previously.

In another embodiment, V1-V2 is higher than 0.5, preferably higher than 1, more preferably higher than 1.5, even better higher than at least one of the following values: 2; 2.5; 3; 3.5; 4, and the front main face exhibits a Ruv value at an angle of incidence of 15° higher than 5% and the back main face exhibits a Ruv value at an angle of incidence of 35° lower than 5%, preferably lower than or equal to 4.5%, more preferably lower than or equal to 4% and even better lower than or equal to 3.5%, with the proviso that the reflection on the front main face at an angle of incidence of 15°, noted R(15°), and/or Rm(15°) (defined hereunder) and/or the average reflectance of the front main face coated with the interferential coating of the invention, between 350 nm and a wavelength comprised between 380 nm and 400 nm, preferably between 350 nm and 380 nm, weighted by the function W(λ), do(es) not exceed the values defined later in this application.

Ruv is the mean reflection factor of a face of an optical article between 280 nm and 380 nm, weighted by the function W(λ) defined in the ISO 13666:1998 standard, measured in the present application at an angle of incidence of 35° for the back main face and at an angle of incidence of 15° for the front main face. Definition of W(λ) and calculation examples for angles of incidence at 30° and 45° are specified in WO 2012/076714. The person skilled in the art can easily implement calculation based on reflection values measured on the respective faces at the wished incidence angle (15°, 35°).

In one embodiment, the optical article according to the invention does not absorb in the visible or not much, which means, in the context of the present application, that its relative light transmission factor in the visible spectrum Tv is higher than or equal to any one of the following values: 87%, 88%, 89%, 90%, 92%, 95%, 96%, 97%, 98%. Said Tv factor preferably ranges from 87% to 98.5%, more preferably from 87% to 97%, even better from 87% to 96%. In another embodiment, Tv ranges from 89% to 98%, preferably from 90% to 98%, better 95% to 97%.

The Tv factor, also called "luminous transmission" of the system, is such as defined in ISO standard 13666:1998 and is measured accordingly to standard ISO 8980-3. It is defined as the average in the 380-780 nm wavelength range that is weighted according to the sensitivity of the eye at each wavelength of the range and measured under D65 illumination conditions (daylight).

The "mean light reflection factor," also called "luminous reflection", noted $R_v$, is such as defined in the ISO 13666: 1998 Standard, and measured in accordance with the ISO 8980-4 Standard (for an angle of incidence lower than 17°, typically of 15°), i.e. this is the weighted spectral reflection average over the whole visible spectrum between 380 and 780 nm.

The mean light reflection factor $R_v$ of the face of the lens coated by an anti-reflection coating according to the invention is preferably lower than 2.5% (per face), preferably lower than 2%, more preferably lower than 1%, even more preferably ≤0.8%, per face of the article.

According to an embodiment of the invention, the reflection R(15°) (measured at an incidence angle of 15°) of the main face of the optical article coated according to the invention is lower than 50% for at least one wavelength in the wavelength range 300-350 nm.

According to another embodiment of the invention, the reflection R(15°) of the main face of the optical article coated according to the invention is lower than 50% at the wavelength 320 nm.

According to an embodiment of the invention, the mean reflection coefficient Rm(15°) (non weighted average reflection) in the wavelength range 300-350 nm of the main face of the optical article coated according to the invention is lower than 50%, preferably lower than or equal to 45%.

The average reflectance of the coated front main face of the interferential coating of the invention, between 350 nm and a wavelength comprised between 380 nm and 400 nm, preferably between 350 nm and 380 nm, weighted by the function W(λ), is generally lower than 35%, preferably lower than or equal to 32%, more preferably lower than or equal to 30% and even better in certain cases lower than or equal to 25% or 20%, for at least one angle of incidence comprised between 0° and 17°.

In each of these embodiments, the total number of layers in the interferential coating, preferably an antireflection coating, is preferably higher than or equal to 3, preferably lower than or equal to 5, and/or the total thickness of the interferential coating (preferably an antireflective coating) plus the thickness of the layer comprising chromium, silicon and oxygen, plus the thickness of the sub-layer plus the thickness of the impedance layer(s) if present is preferably lower than 1 micrometer, more preferably lower than or equal to 800 nm or 500 nm.

The definition of the average reflectance and function W(λ) is described in WO 2016/102857. W(λ) is also described in WO 2012/076714.

The colorimetric coefficients C* and h of the optical article of the invention in the international colorimetric CIE L*a*b* are calculated between 380 and 780 nm, taking the standard illuminant D65 and the observer into account (angle of incidence: 15°). The observer is a "standard observer" (10°) as defined in the international colorimetric system CIE L*a*b*.

The colorimetric coefficients of the lenses of the invention have a good robustness. The robustness σh of the optical article, defined in WO 2015/000534, is satisfactory, and preferably lower than or equal to 8, more preferably lower than or equal to 7.5, for a hue angle h corresponding to green.

The angular sensitivity dH* (chromatic hue difference between incident angle 45° and incident angle 0°), defined in CIE L*a*b* 1976, is preferably lower than or equal to 15, preferably lower than or equal to 10.

It is possible to prepare interferential coatings without limitation as regards their hue angle (h), which relates to the residual color displayed by said interferential coating, and preferably ranges from 40° to 300°, more preferably from 50° to 290°. In some embodiments, the optical article has a hue angle (h) ranging from 240° to 300°, preferably from 250° to 290°, more preferably from 260° to 280°, thus resulting in a perceived residual reflected color blue to violet, preferably close to violet. In another embodiment, the optical article has a hue angle (h) higher than or equal to 135°, more preferably higher than or equal to 140° and better ranging from 140° to 160°, thus resulting in an interferential coating having a green reflection. In another embodiment, the optical article has a hue angle (h) ranging from 40° to 90°, preferably 50° to 90°, better 50° to 70°, thus resulting in an interferential coating having a gold reflection.

In some aspects of the invention, the interferential coating has a chroma (C*) that is lower than 15 (for an angle of incidence of 15°), more preferably lower than 10. Obtaining low residual color intensity (chroma) articles is preferable with respect to wearer's comfort viewpoint, in the cases of lenses.

The invention further relates to a method of manufacturing an optical article such as described hereabove, comprising:
providing an optical article comprising a substrate having at least one main face,
depositing onto a main surface of the substrate a layer comprising chromium, silicon and oxygen,
depositing a monolayer sub-layer having an exposed surface and a thickness higher than or equal to 100 nm onto said layer comprising chromium, silicon and oxygen,
depositing onto said exposed surface of the sub-layer a multilayer interferential coating comprising at least one high refractive index layer having a refractive index higher than 1.55 and at least one low refractive index layer having a refractive index of 1.55 or less, thereby obtaining a coated optical article, wherein the ratio $R_D$ is higher than or equal to 1.5, and the coated optical article has a Bayer value determined in accordance with the ASTM F735-81 standard higher than or equal to 7.

In preferred embodiments, the exposed surface of the sub-layer has been submitted to an ionic bombardment treatment prior to depositing said multilayer interferential coating, and/or the deposition of the sub-layer is conducted in a vacuum chamber in which no supplementary gas is supplied during said deposition.

In one embodiment, the exposed surface of at least one layer of the multilayer interferential coating has been submitted to an ionic bombardment treatment prior to depositing the subsequent layer of said multilayer interferential coating.

In one embodiment, the present optical article is prepared by forming on the substrate a primer coating and/or an abrasion- and/or scratch-resistant coating in a first manufacturing site, while the other coatings are formed in a second manufacturing site.

The following examples illustrate the present invention in a more detailed, but non-limiting manner. Unless stated otherwise, all thicknesses disclosed in the present application relate to physical thicknesses. The percentages given in the tables are weight percentages. Unless otherwise specified, the refractive indexes referred to in the present invention are expressed at 20-25° C. for a wavelength of 550 nm.

EXAMPLES

1. General Procedures

The articles employed in the examples comprise a 65 mm-diameter ORMA® lens substrate (polymer obtained by polymerization of diethylene glycol bis (allyl carbonate) from Essilor based on CR-39® monomer, refractive index=1.5), with a power of −2.00 diopters and a thickness of 1.2 mm, coated on its convex face with the impact resistant primer coating disclosed in the experimental part of WO 2010/109154 (modified by adding colloidal silica at a $SiO_2$ solid content of 9% in the W234™ polyurethane composition in all the examples, n=1.5) and the abrasion- and scratch-resistant coating (hard coat) disclosed in example 3 of EP 0614957, an anti-reflection coating having a specific $R_D$ ratio, and the antifouling coating disclosed in the experimental section of patent application WO 2010/109154, i.e., by evaporation under vacuum of the Optool DSX® compound marketed by Daikin Industries (thickness: from 2 to 5 nm).

The various layers such as the adherence layers comprising chromium, silicon and oxygen, sub-layers, optical impedance layers and the layers of the antireflection coating were deposited without heating the substrates, by vacuum evaporation, optionally assisted (IAD) during the deposition by a beam of oxygen and possibly argon ions, when specified (evaporation source: electron gun), and optionally under pressure regulation by supplying (passive) $O_2$ gas into the chamber, where indicated.

The layer comprising chromium, silicon and oxygen was made from the Malbunit 8/1 material, provided by the Umicore Materials AG company. This material comprises 84.4% by weight of $SiO_2$ and 15% by weight of Cr (metallic chromium).

The vacuum evaporation device that made it possible to deposit the various antireflective layers was a Syrus III machine having two systems for evaporating materials, an electron gun evaporation system and a thermal evaporator (Joule-effect evaporation system), and a KRI EH 1000 F ion gun (from Kaufman & Robinson Inc.) for use in the preliminary phase of preparation of the surface of the substrate by argon ion bombardment (IPC) and in the ion-assisted deposition (IAD) of the layers.

2. Preparation of the Optical Articles

The lenses were placed on a carrousel provided with circular openings intended to accommodate the lenses to be treated, the concave side facing the evaporation sources and the ion gun.

The method for producing optical articles comprises introducing the lens substrate provided with the primer and abrasion-resistant coatings into a vacuum deposition chamber, conducting a pumping step until a high vacuum was created, followed by an ion gun conditioning step (IGC, such as disclosed in FR 2957454, $3.5 \times 10^{-5}$ mBar as starting pressure, 140 V, 3.5 A, argon, 60 seconds), a substrate surface activation step using a bombardment with an argon ion beam (IPC) with a starting pressure of $5 \cdot 10^{-4}$ mBar (the ion gun was set to 3 A, 150 V, 60 seconds), stopping the ionic irradiation, and then successively evaporating the required number of layers (optional intermediate optical impedance layers, layer comprising chromium, silicon and oxygen, sub-layer, anti-reflection coating layers and antifouling coating) at a rate ranging from 0.4 to 3 nm/s, and lastly a ventilation step.

Forming an antireflection stack according to the present invention comprises a deposition step of a Malbunit 8/1 layer at a rate of 0.5 nm/s, a deposition step of a $SiO_2$ sub-layer at a rate of 3 nm/s optionally under an $O_2$ atmosphere (at a pressure of $1.6 \times 10^{-4}$ mBar in comparative example 1 where $O_2$ gas was supplied, or $4\text{-}5 \times 10^{-5}$ mBar in the examples of the invention where no supplementary gas supply was performed), a surface activation step of the sub-layer using an argon ion beam for 30 seconds (same treatment as IPC already conducted directly on the substrate), a deposition step of a HI layer ($ZrO_2$) at a rate of 2 nm/s under an $O_2$ pressure of $7 \cdot 10^{-5}$ mBar ($6 \cdot 10^{-5}$ mBar in examples 2 and 3), a deposition step of a LI layer ($SiO_2$) at a rate of 2 nm/s, a deposition step of a HI layer ($ZrO_2$) at a rate of 2 nm/s under an $O_2$ pressure of $7 \cdot 10^{-5}$ mBar ($6 \cdot 10^{-5}$ mBar in examples 2 and 3), a deposition step of an $SnO_2$ layer (HI, electrically conductive) at a rate of 1 nm/s with an oxygen ion assistance (ion gun: 2 A, 120 V), a deposition step of a LI layer ($SiO_2$) at a rate of 2-3 nm/s, and lastly a deposition step of an Optool DSX® layer at a rate of 0.4 nm/s.

In examples 2 and 3, a surface activation step using an argon ion beam for 30 seconds (same treatment as IPC already conducted directly on the substrate) was performed on the 26.5 nm thick $ZrO_2$ layer. In example 3, a surface activation step using an argon ion beam for 30 seconds (same treatment as IPC already conducted directly on the substrate) was performed on the 38 nm thick $SiO_2$ layer.

In comparative example 1, the Malbunit 8/1 layer was omitted.

3. Testing Methods

The following test procedures were used to evaluate the optical articles prepared according to the present invention. Several samples for each system were prepared for measurements and the reported data were calculated with the average of 40-100 data points.

Colorimetric measurements (in reflection) of the face coated with the stack of the invention: reflection factor Rv, hue angle h and chroma C* in the international colorimetric CIE (L*, a*, b*) space were carried out with a Zeiss spectrophotometer, taking into account the standard illuminant D65, and the standard observer 10° (for h and C*). They are provided for an angle of incidence of 15°.

The critical temperature of the article was measured in the manner indicated in patent application WO 2008/001011. It was measured one week after production of the article.

The thickness of the layers was controlled by means of a quartz microbalance.

Abrasion resistance was determined as disclosed in WO 2012/173596. Specifically, abrasion resistance was measured by means of the sand Bayer test, in accordance with the ASTM F735-81 standard, one week after production of the article.

The inventors noticed that the Bayer value of the article is decreasing after it has been manufactured. It is preferable to measure the value after stabilization, e.g., at least 1 week after it has been manufactured. In this application, the Bayer values for the examples have been measured 1 week after the articles have been manufactured.

The adhesion properties of the whole of the interference coating to the substrate were verified on the convex face of the lens by means of the test commonly referred to in French as the "n×10 coups" test (i.e. the "n×10 blows" test) described in international patent applications WO 2010/109154 and WO 99/49097. The test is performed in accordance with ISTM 02-011. Briefly, a sample to be tested is placed in a clamp and covered with a selvyt cloth impregnated with isopropyl alcohol. An eraser positioned on a holder moving in translation is put in contact with the cloth. The eraser is pressed down (force=60 Newtons) on the selvyt cloth placed in contact with the lens. The test consists in the determination, for each sample, of the number of cycles required to cause a defect to appear in the antireflection coating. Therefore, the higher the value obtained in the n×10 blows test (average on 10, 16 or 24 samples), the better the adhesion of the interference coating to the substrate. An article successfully passed the test if there is no defect after 20 cycles.

4. Results

The structural characteristics and the optical, mechanical and thermo-mechanical performances of the ophthalmic lenses obtained in the examples are detailed hereunder. The sub-layer is gray-colored. The total thickness mentioned is the thickness of the stack comprising the antireflection coating and the following additional layers, when present: layer comprising chromium, silicon and oxygen, sub-layer, optical impedance layer(s).

| Comparative example 1 | |
|---|---|
| Substrate + primer/hard coat | |
| $SiO_2$ (a, b) | 130 nm |
| $ZrO_2$ (b) | 26 nm |
| $SiO_2$ | 39 nm |
| $ZrO_2$ (b) | 42 nm |
| $SnO_2$ | 6.5 nm |
| $SiO_2$ | 100 nm |
| Top coat | |
| $R_D$ | 2.06 |
| $R_T$ | 2.05 |
| Sand Bayer | 6.8 |
| Tc | 62° C. |
| C* | 10.5 |
| h (°) | 147 |
| σh | 7.31 |
| dH* | 6.60 |
| Rv | 0.79% |
| Total thickness | 343 nm |
| n×10 blows test | 10/10 pass |

| Example 3 | |
|---|---|
| Substrate + primer/hard coat | |
| Malbunit 8/1 | 2.5 nm |
| SiO$_2$ (a) | 150 nm |
| ZrO$_2$ (a, b) | 26.5 nm |
| SiO$_2$ (a) | 38 nm |
| ZrO$_2$ (a, b) | 42 nm |
| SnO$_2$ | 6.5 nm |
| SiO$_2$ | 100 nm |
| Top coat | |
| R$_D$ | 2.05 |
| R$_T$ | 2.01 |
| Sand Bayer | 10 |
| Tc | 60° C. |
| C* | 10.36 |
| h (°) | 147 |
| σh | 7.5 |
| dH* | 6.03 |
| Rv | 0.80% |
| Total thickness | 366 nm |
| nx10 blows test | 24/24 pass |

| Example 1 | |
|---|---|
| Substrate + primer/hard coat | |
| Malbunit 8/1 | 2.5 nm |
| SiO$_2$ (a) | 150 nm |
| ZrO$_2$ (b) | 26.5 nm |
| SiO$_2$ | 38 nm |
| ZrO$_2$ (b) | 42 nm |
| SnO$_2$ | 6.5 nm |
| SiO$_2$ | 100 nm |
| Top coat | |
| R$_D$ | 2.05 |
| R$_T$ | 2.01 |
| Sand Bayer | 8.7 |
| Tc | 60° C. |
| C* | 10.36 |
| h (°) | 147 |
| σh | 7.5 |
| dH* | 6.03 |
| Rv | 0.80% |
| Total thickness | 366 nm |
| nx10 blows test | 14/16 pass |

| Example 2 | |
|---|---|
| Substrate + primer/hard coat | |
| Malbunit 8/1 | 2.5 nm |
| SiO$_2$ (a) | 150 nm |
| ZrO$_2$ (a, b) | 26.5 nm |
| SiO$_2$ | 38 nm |
| ZrO$_2$ (b) | 42 nm |
| SnO$_2$ | 6.5 nm |
| SiO$_2$ | 100 nm |
| Top coat | |
| R$_D$ | 2.05 |
| R$_T$ | 2.01 |
| Sand Bayer | 9.4 |
| Tc | 60° C. |
| C* | 10.36 |
| h (°) | 147 |
| σh | 7.5 |
| dH* | 6.03 |
| Rv | 0.80% |

-continued

| Example 2 | |
|---|---|
| Total thickness | 366 nm |
| nx10 blows test | 9/10 pass |

(a) Ionic bombardment treatment of the layer surface before depositing the next layer.
(b) Oxygen supply during deposition.

In all examples, there are two adjacent high refractive index layers in outermost position in the interferential coating. This means that the thicknesses of these two adjacent layers are taken into account for the calculation of the denominator of the R$_D$ ratio.

Optical articles according to the invention, having a high R$_D$ ratio, a Malbunit 8/1 layer and a sub-layer, exhibit better abrasion resistance than comparative articles, while keeping a similar critical temperature and level of anti-reflection performance. Avoiding gas supply during deposition of the sub-layer dramatically improves the abrasion resistance (compare comparative example 1 with example 1). Performing an ionic bombardment treatment of the surface of one or more layers of the antireflection coating before depositing the next layer further improves the abrasion resistance (see examples 1, 2 and 3).

In example 1, the stress in the sub-layer was −456 MPa. Stresses were measured in the manner described in WO 2014/199103, by depositing the Malbunit 8/1 layer and the sub-layer on a silicon wafer substrate deposited under the same conditions as in example 1.

The stress measured is actually the stress of the whole stack Malbunit 8/1 and the sublayer, which by definition, will be assimilated to the stress of the sub-layer.

The invention claimed is:

1. An optical article comprising a substrate having at least one main face successively coated with:
   a layer comprising chromium, silicon and oxygen;
   a monolayer sub-layer having a thickness higher than or equal to 100 nm;
   a multilayer interferential coating comprising a stack of at least one high refractive index layer having a refractive index higher than 1.55 and at least one low refractive index layer having a refractive index of 1.55 or less, wherein the ratio:

$$R_D = \frac{\text{thickness of the outermost low refractive index layer(s) of the interferential coating}}{\text{thickness of the outermost high refractive index layer(s) of the interferential coating}}$$

is higher than or equal to 1.7; and
wherein the optical article has a Bayer value determined in accordance with the ASTM F735-81 standard higher than or equal to 7.

2. The optical article claim 1, wherein the sub-layer has a thickness higher than or equal to 120 nm.

3. The optical article claim 1, wherein the sub-layer has a thickness higher than or equal to 130 nm.

4. The optical article claim 1, wherein the sub-layer is a SiO$_2$-based layer.

5. The optical article claim 1, wherein the sub-layer is in direct contact with the interferential coating.

6. The optical article claim 1, wherein the sub-layer is under compression with a compressive stress lower than −250 MPa.

7. The optical article claim 1, wherein the layer comprising chromium, silicon and oxygen has a thickness lower than or equal to 10 nm.

8. The optical article claim 1, wherein the layer comprising chromium, silicon and oxygen has a refractive index higher than 1.55.

9. The optical article claim 1, wherein the layer comprising chromium, silicon and oxygen is in direct contact with the sub-layer.

10. The optical article claim 1, wherein the deposition of the sub-layer is conducted in a vacuum chamber under a pressure lower than $1.6 \times 10^{-4}$ mBar.

11. The optical article claim 1, wherein the deposition of the sub-layer is conducted in a vacuum chamber in which no supplementary gas is supplied during said deposition.

12. The optical article claim 1, wherein the interferential coating is an antireflection coating.

13. The optical article claim 1, wherein the optical article is an ophthalmic lens.

14. A method of manufacturing the optical article of claim 1, comprising:
   providing an optical article comprising a substrate having at least one main face;
   depositing onto a main surface of the substrate a layer comprising chromium, silicon and oxygen;
   depositing a monolayer sub-layer having an exposed surface and a thickness higher than or equal to 100 nm onto said layer comprising chromium, silicon and oxygen;
   depositing onto said exposed surface of the sub-layer a multilayer interferential coating comprising at least one high refractive index layer having a refractive index higher than 1.55 and at least one low refractive index layer having a refractive index of $$R_D = \frac{\text{thickness of the outermost low refractive index layer(s) of the interferential coating}}{\text{thickness of the outermost high refractive index layer(s) of the interferential coating}}$$

is higher than or equal to 1.7; and
   wherein the coated optical article has a Bayer value determined in accordance with the ASTM F735-81 standard higher than or equal to 7.

15. The method of claim 14, wherein the exposed surface of the sub-layer is submitted to an ionic bombardment treatment prior to depositing said multilayer interferential coating, and wherein the deposition of the sub-layer is conducted in a vacuum chamber in which no supplementary gas is supplied during said deposition.

16. The method of claim 14, wherein the exposed surface of at least one layer of the multilayer interferential coating has been submitted to an ionic bombardment treatment prior to depositing the subsequent layer of said multilayer interferential coating.

* * * * *

UNITED STATES PATENT AND TRADEMARK OFFICE
CERTIFICATE OF CORRECTION

| | |
|---|---|
| PATENT NO. | : 12,092,908 B2 |
| APPLICATION NO. | : 17/285591 |
| DATED | : September 17, 2024 |
| INVENTOR(S) | : Benoit Emprin, Nicolas Maitre and Sébastien Chiarotto |

It is certified that error appears in the above-identified patent and that said Letters Patent is hereby corrected as shown below:

In the Claims

Claim 14, Column 26, Line 5:
Insert --1.55 or less, thereby obtaining a coated optical article, wherein the ratio-- after "index of".

Signed and Sealed this
Nineteenth Day of November, 2024

Katherine Kelly Vidal
*Director of the United States Patent and Trademark Office*